United States Patent
Yu et al.

(10) Patent No.: US 6,362,958 B1
(45) Date of Patent: Mar. 26, 2002

(54) DETACHABLE COOLING DEVICE FOR COMPUTER

(75) Inventors: Ming-Chuan Yu, 16-6, No. 1071, Chung Cheng Road, Taoyuan; Chung Che Yu, Taipei Hsien, both of (TW)

(73) Assignee: Ming-Chuan Yu (TW)

( * ) Notice: Subject to any disclaimer, the term of this patent is extended or adjusted under 35 U.S.C. 154(b) by 0 days.

(21) Appl. No.: 09/637,781

(22) Filed: Aug. 11, 2000

(51) Int. Cl.[7] .................................................. H05K 7/20
(52) U.S. Cl. ....................... 361/687; 361/695; 361/697; 454/184; 165/104.34
(58) Field of Search ...................... 361/683, 685–689, 361/692–699, 690, 715, 727, 725, 700–702; 454/184; 55/385.4, 467, 471, 473; 165/80.4, 165, 121–126, 58, 104.32, 104.34; 415/208, 208.1, 177.1, 178, 208.2, 208.3, 182.1, 187, 203, 213.1; 364/708.1; 429/26, 27; 340/607; 307/66, 125; 351/82; 416/223 R; 174/35 R, 35 MS

(56) References Cited

U.S. PATENT DOCUMENTS

| 4,931,904 | A | * | 6/1990 | Yiu ............................. 361/384 |
| 5,871,396 | A | * | 2/1999 | Shen ........................... 454/184 |
| 5,876,278 | A | * | 3/1999 | Cheng ......................... 454/184 |
| 5,955,955 | A | * | 9/1999 | Corcoran et al. ........... 340/607 |
| 6,034,871 | A | * | 3/2000 | Cheng ......................... 361/695 |
| 6,042,474 | A | * | 3/2000 | Harvey et al. .............. 454/184 |
| 6,058,009 | A | * | 5/2000 | Hood et al. ................. 361/687 |
| 6,104,607 | A | * | 8/2000 | Behl ............................ 361/687 |
| 6,163,454 | A | * | 12/2000 | Strickler ..................... 361/695 |

FOREIGN PATENT DOCUMENTS

| JP | 02000-099209 A | * | 4/2000 | ............ G06F/1/20 |
| JP | 02001-014068 A | * | 1/2001 | ............ G06F/1/20 |

* cited by examiner

*Primary Examiner*—Leo P. Picard
*Assistant Examiner*—Michael Datskovsky
(74) *Attorney, Agent, or Firm*—Troxell Law Office PLLC

(57) ABSTRACT

A detachable cooling device adapted for installation in the shell of a computer mainframe to dissipate heat from the computer mainframe, including a fan case holding a fan and a positioning device adapted to secure the fan case to the shell of the computer mainframe, the fan case having a plurality of air inlets on the top side wall thereof corresponding to the fan therein, a plurality of air outlets on the front side wall thereof, two recessed receiving wall portions respectively formed integral with top and bottom side walls thereof around the air outlets for holding the positioning device, and a plurality of spring hooks respectively formed integral with the recessed receiving wall portions for engaging into respective retaining holes on the positioning device to secure the fan case to the positioning device.

3 Claims, 7 Drawing Sheets

DETACHABLE COOLING DEVICE FOR COMPUTER

BACKGROUND OF THE INVENTION

The present invention relates to cooling devices for computer, and more particularly to a detachable cooling device, which can be alternatively used with different positioning devices for installation in different insertion slots on the shell of the computer mainframe.

During the operation of a computer, the internal CPU and hardware component parts of the computer produce much heat, and heat must be quickly carried away from the computer so as not to affect normal operation of the computer. According to conventional methods, fan or fans are installed in the AC adapter inside the computer mainframe, and operated to draw hot air out of the computer mainframe upon operation of the computer. The cooling arrangement is still not satisfactory in function.

SUMMARY OF THE INVENTION

It is one object of the present invention to provide a cooling device for computer, which is detachable. It is another object of the present invention to provide a cooling device for computer, which can be alternatively arranged for installation in different insertion slots on the shell of the computer mainframe. According to one aspect of the present invention, the detachable cooling device comprises a fan case holding a fan, and a positioning device adapted to secure the fan case to the shell of the computer mainframe, wherein the fan case has a plurality of air inlets on the top side wall thereof corresponding to the fan therein, and a plurality of air outlets on the front side wall thereof in communication with the air inlets. According to another aspect of the present invention, the fan case comprises two recessed receiving wall portions respectively formed integral with top and bottom side walls thereof around the air outlets for holding the positioning device, and a plurality of spring hooks respectively formed integral with the recessed receiving wall portions for engaging into respective retaining holes on the positioning device to secure the fan case to the positioning device. According to still another aspect of the present invention, the positioning device can be made in any of a variety of forms to fit different insertion slots on the shell of the mainframe of the computer.

DETAILED DESCRIPTION OF THE PREFERRED EMBODIMENT

Figure 1:
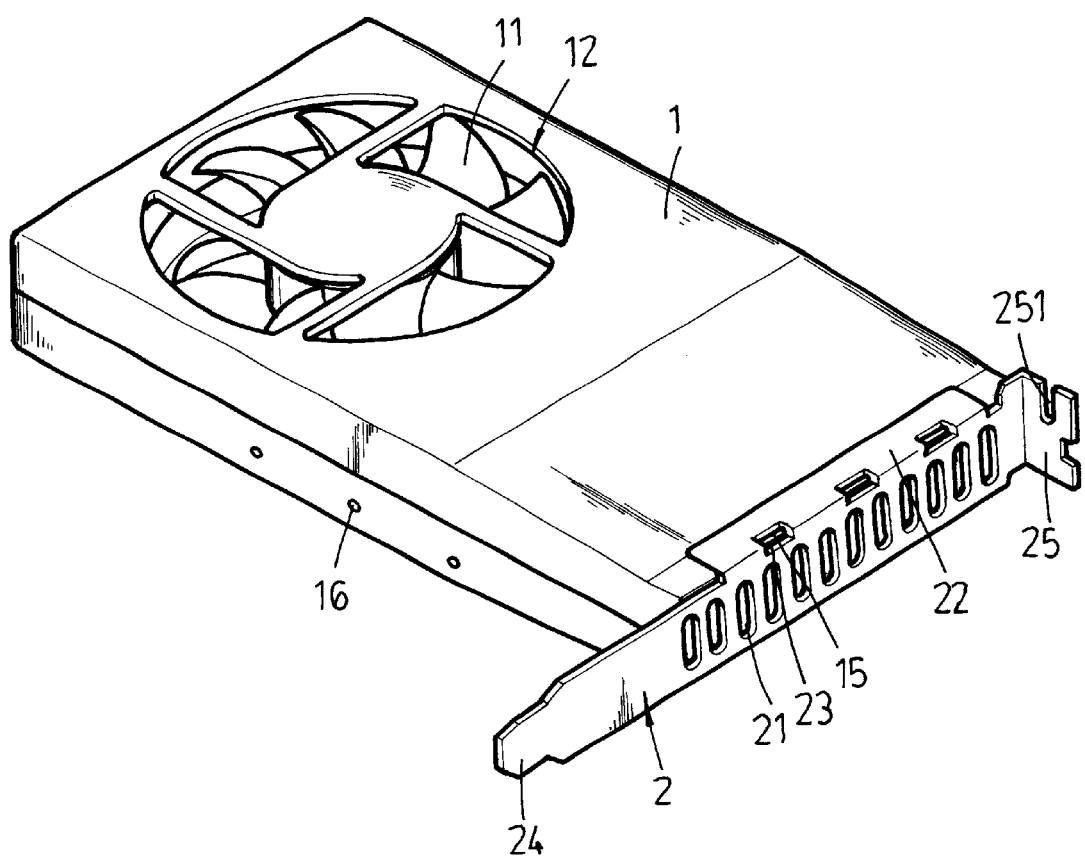
FIG. 1 is an elevational view showing the fan case used with the first (hanging bar type) positioning device for installation in an interface card insertion slot on the shell for computer mainframe according to the present invention.

Referring to FIGS. From 1 through 3, a detachable cooling device for computer in accordance with the present invention is generally comprised of a fan case 1 holding a fan 11, and a positioning device 2, 3 or 4 adapted to secure the fan case 1 in a computer mainframe. The fan case 1 comprises a plurality of air inlets 12 on the top side wall thereof corresponding to the fan 11, a plurality of air outlets 13 on the front side wall thereof, a plurality of screw holes 16 on the two opposite lateral side walls thereof, two recessed receiving wall portions 14 respectively formed integral with the top and bottom side walls thereof around the air outlets 13, and a plurality of spring hooks 15 respectively formed integral with the recessed receiving wall portions 14.

Figure 2:
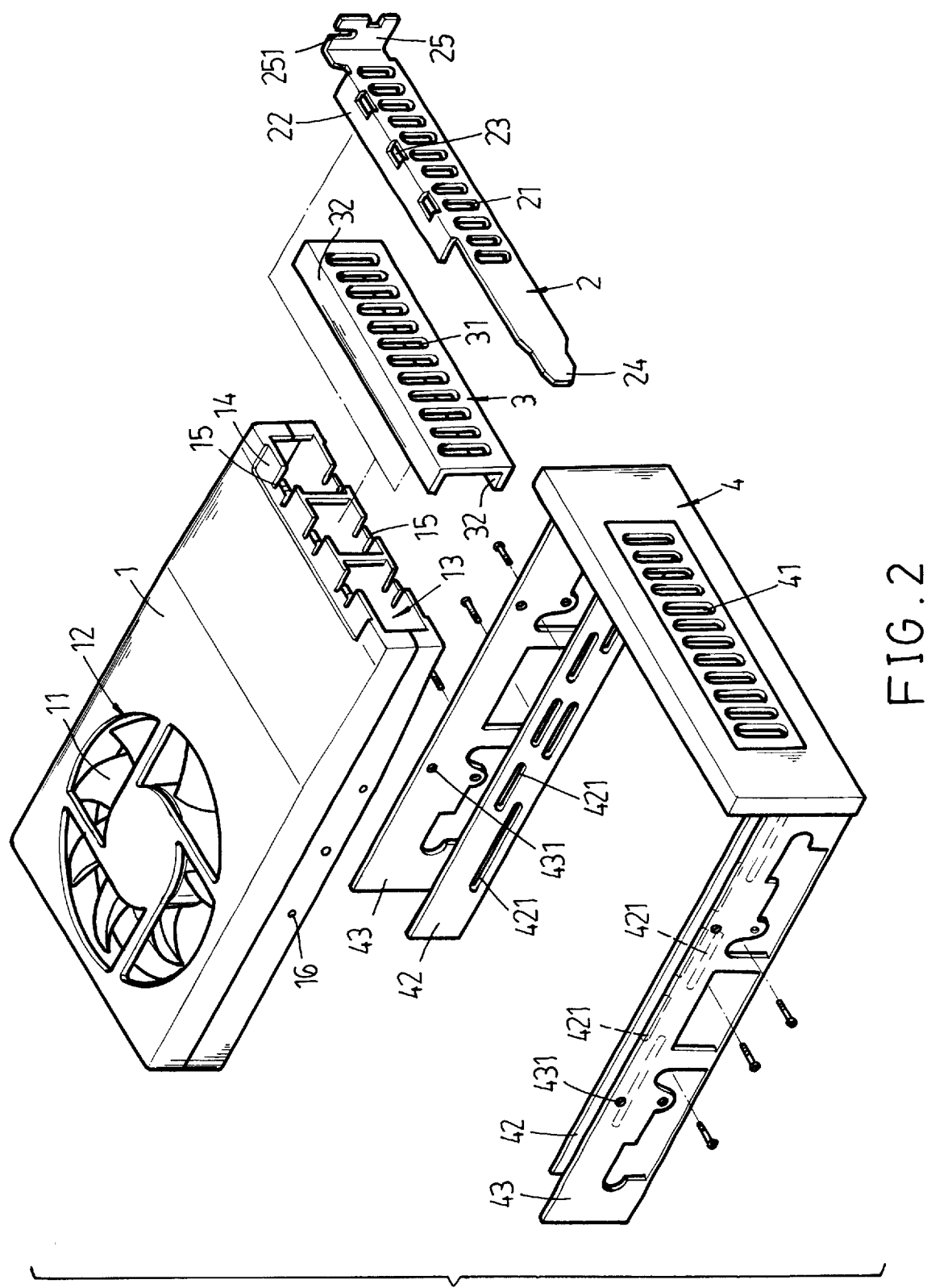
FIG. 2 illustrates a fan case, and three different positioning devices adapted for use with the fan case according to the present invention.
Figure 3:
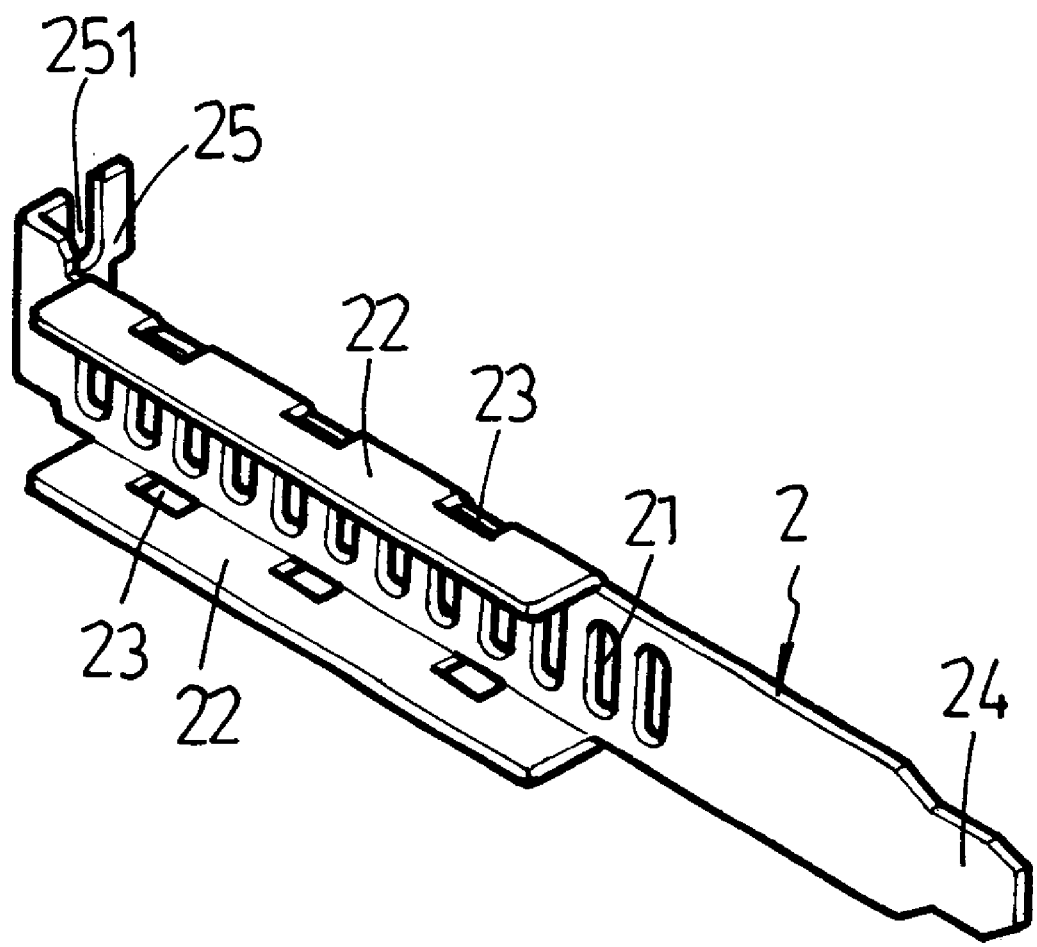
FIG. 3 is a perspective view of the first (hanging bar type) positioning device according to the present invention.
Figure 4:
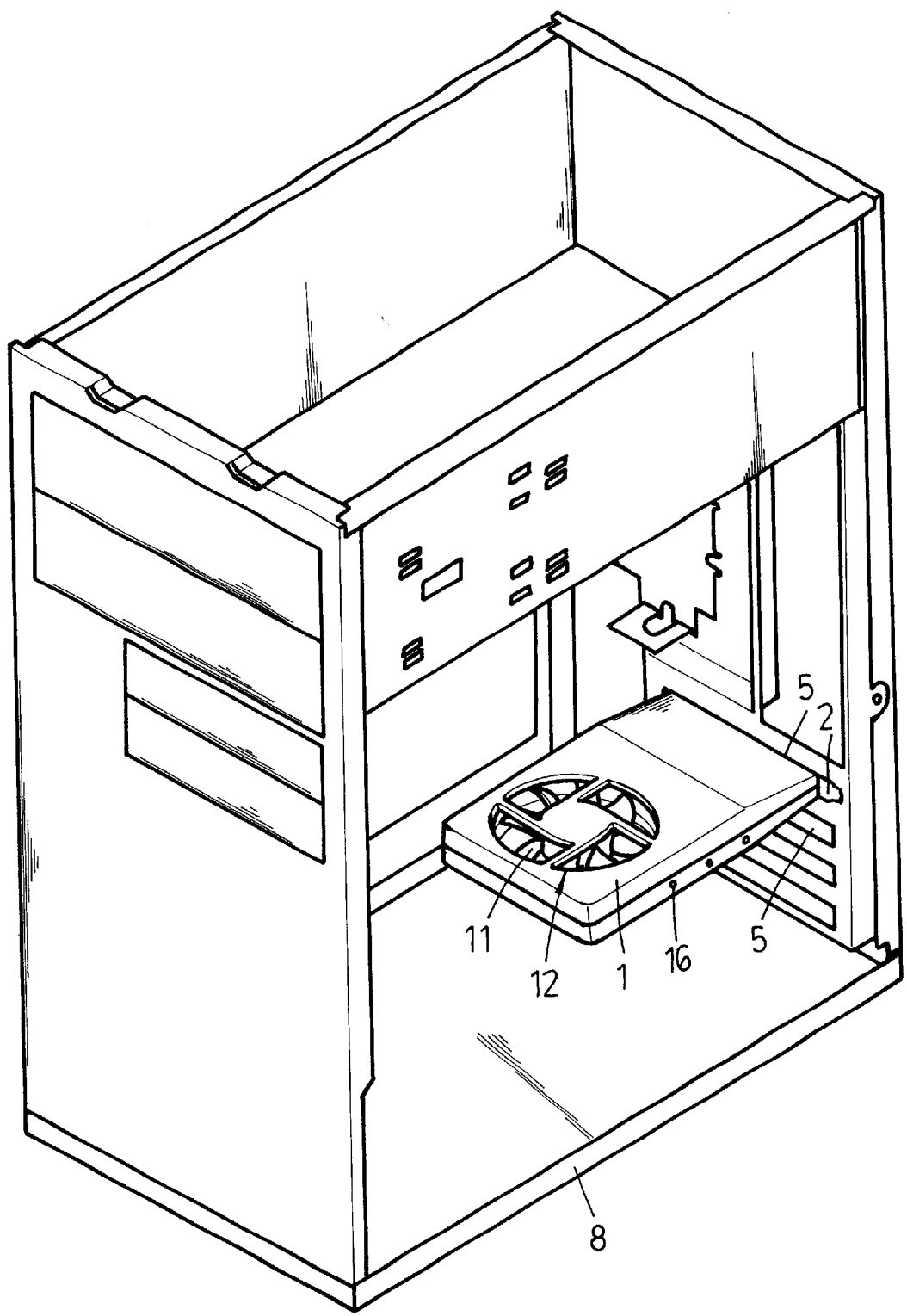
FIG. 4 shows the fan case used with the hanging bar type positioning device and installed in the shell for computer mainframe according to the present invention.
Figure 5:
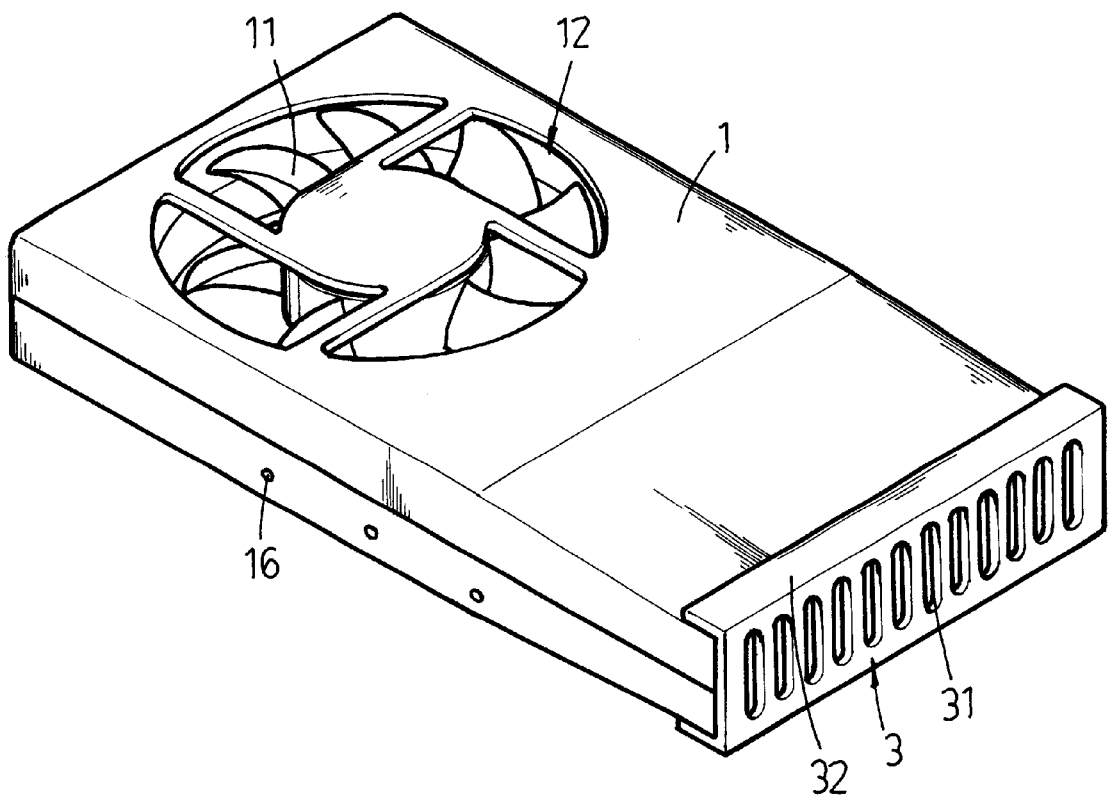
FIG. 5 is an elevational view showing the fan case used with the second positioning device for installation in a floppy diskdrive insertion slot on the shell of the computer mainframe.
Figure 6:
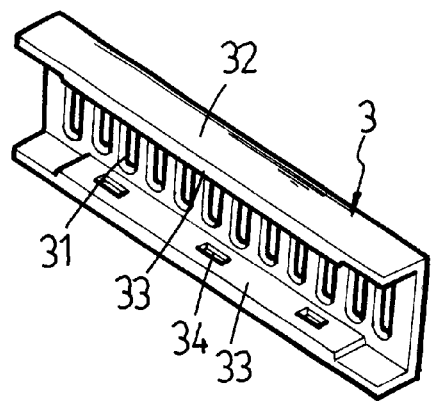
FIG. 6 is an elevational view of the second positioning device according to the present invention.

Referring to FIGS. 1, 2 and 4, the positioning device referenced by 2 is a hanging bar adapted to secure the fan case 1 to an interface card insertion slot 5 on a shell 8 for computer mainframe, comprising a plurality of longitudinally equally spaced air vents 21 for output of air from the air outlets 13 of the fan case 1 upon operation of the fan 11, top and bottom coupling flanges 22 adapted to engage the recessed receiving wall portions 14 of the fan case 1, a plurality of retaining holes 23 respectively formed on the coupling flanges 22 and adapted to receive the spring hooks 15 of the fan case 1, a plug strip 24 and a locating flange 25 respectively extended from the two distal ends thereof and adapted for fastening to the interface card insertion slot 5 of the shell 8. The locating flange 25 has a mounting hole 251 adapted to receive a screw bolt. After installation of the hanging bar (positioning device) 2, the fan case 1 is firmly secured to the inside of the shell 8. When the fan 1 is started, it draw hot air from the inside of the shell 8 through the air inlets 12 and the air outlets 13 to the outside of the shell 8 via the air vents 21 of the hanging bar 2.

Referring to FIGS. 2, 5, 6 and 7, the positioning device referenced by 3 is adapted to secure the fan case 1 to a floppy diskdrive insertion slot 6 on the shell 8, comprising a plurality of air vents 31 longitudinally equally spaced on the front side wall thereof for output of air from the air outlets 13 of the fan case 1 upon operation of the fan 11, top and bottom side walls 32 perpendicularly backwardly extended from top and bottom sides of the front side wall, two protruding engagement portions 33 respectively raised from the top and bottom side walls 32 and adapted to engage the recessed receiving wall portions 14 of the fan case 1, a plurality of retaining holes 34 respectively formed on the protruding engagement portions 33 and adapted to receive the spring hooks 15 of the fan case 1. After installation in the floppy diskdrive insertion slot 6, the positioning device 3 is disposed in flush with the front sidewall of the shell 8.

Figure 7:
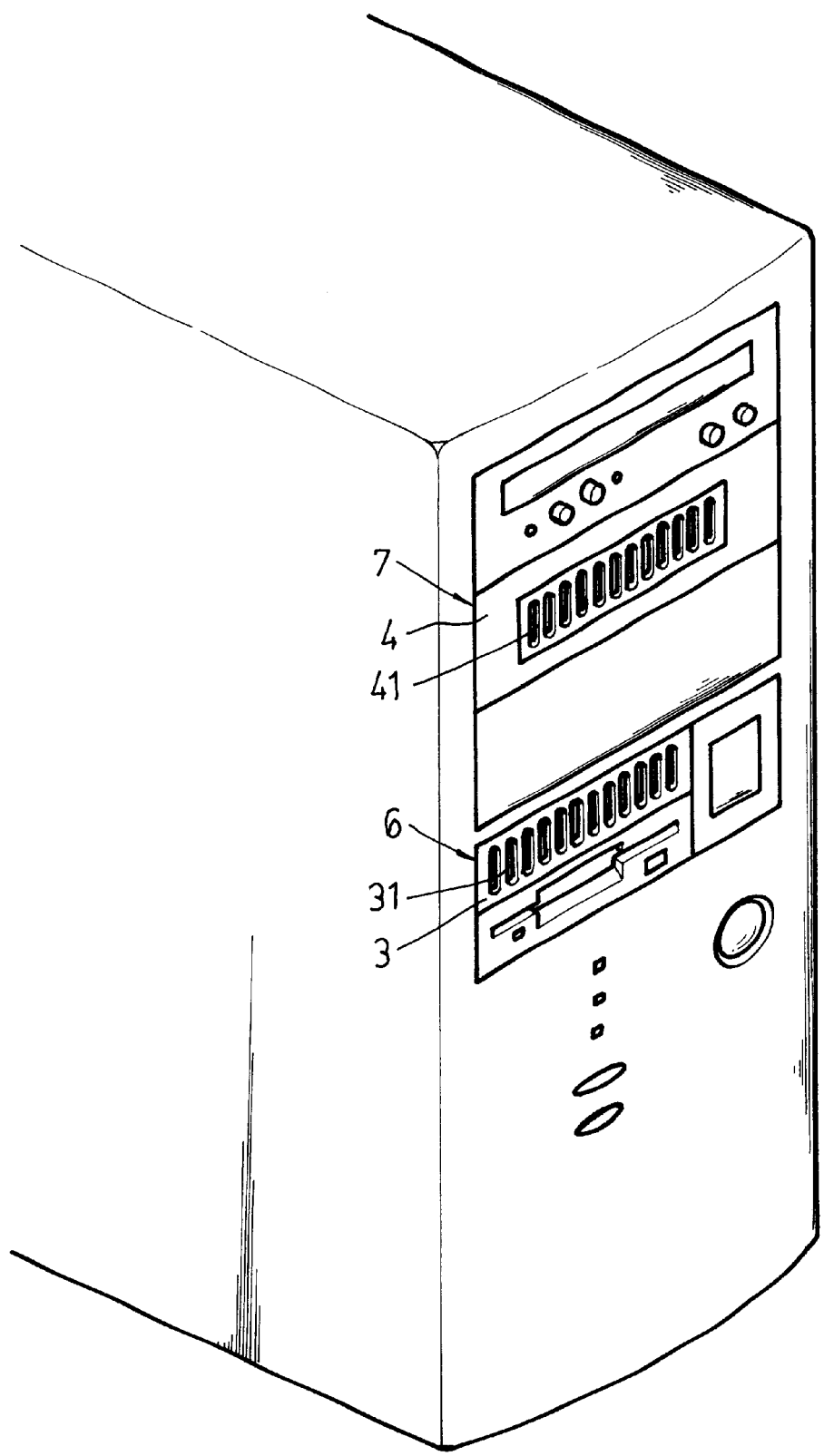
FIG. 7 is an elevational view of a computer mainframe showing two installation examples of the present invention.
Figure 8:
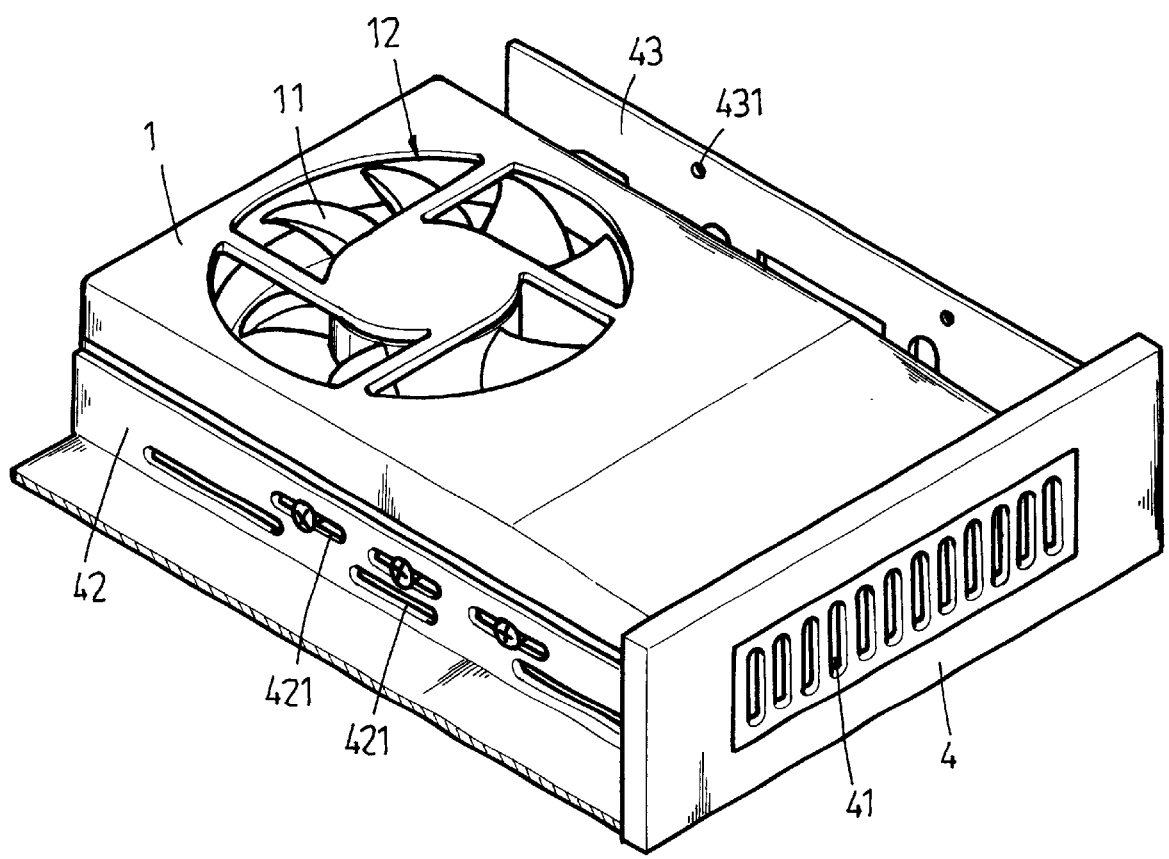
FIG. 8 is an elevational view showing the fan case used with the third positioning device according to the present invention.

Referring to FIGS. 2, 7 and 8, the positioning device referenced by 4 is a mobile rack adapted to secure the fan case 1 to a hard diskdrive insertion slot 7 on the shell 8, comprising a plurality of air vents 41 longitudinally equally spaced on the front side wall thereof for output of air from the air outlets 13 of the fan case 1 upon operation of the fan 11, two outer mounting strips 43 perpendicularly backwardly extended from two distal ends of the front side wall, and two inner mounting strips 42 perpendicularly backwardly extended from the front side wall and spaced between the outer mounting strips 43. The outer mounting strips 43 each have a plurality of screw holes 431 adapted for fastening to the hard diskdrive insertion slot 7 of the shell 8 by screws. The inner mounting strips 42 each have a plurality of elongated mounting slots 421. After insertion of the fan case 1 into the positioning device 4 between the inner mounting strips 42, screws are installed in the mounting slots 421 and threaded into the screw holes 16 to fixedly secure the fan case 1 to the positioning device 4, keeping the air outlets 13 in communication with the air vents 41 for output of air.

It is to be understood that the drawings are designed for purposes of illustration only, and are not intended for use as a definition of the limits and scope of the invention disclosed.

What the invention claimed is:

1. A detachable cooling device adapted for installation in the shell of a computer mainframe to dissipate heat from the computer mainframe, comprising:

a fan case holding a fan, said fan case comprising a plurality of air inlets on a top side wall thereof corresponding to the fan therein, a plurality of air outlets on a front side wall thereof, a plurality of screw holes on two opposite lateral side walls thereof, two recessed receiving wall portions respectively formed integral with top and bottom side walls thereof around said air outlets, and a plurality of spring hooks respectively formed integral with said recessed receiving wall portions; and a positioning device adapted to secure said fan case to an interface card insertion slot on the shell of the computer mainframe, said positioning device comprising a plurality of longitudinally equally spaced air vents for output of air from said air outlets of said fan case upon operation of said fan, top and bottom coupling flanges adapted to engage the recessed receiving wall portions of said fan case, a plurality of retaining holes respectively formed on said coupling flanges and adapted to receive the spring hooks of said fan case, a plug strip and a locating flange respectively extended from two distal ends thereof and adapted for fastening to the interface card insertion slot of the shell.

2. A detachable cooling device adapted for installation in the shell of a computer mainframe to dissipate heat from the computer mainframe, comprising:

a fan case holding a fan, said fan case comprising a plurality of air inlets on a top side wall thereof corresponding to the fan therein, a plurality of air outlets on a front side wall thereof, a plurality of screw holes on two opposite lateral side walls thereof, two recessed receiving wall portions respectively formed integral with top and bottom side walls thereof around said air outlets, and a plurality of spring hooks respectively formed integral with said recessed receiving wall portions; and a positioning device adapted to secure said fan case to a floppy diskdrive insertion slot on the shell of the computer mainframe, said positioning device comprising a plurality of air vents longitudinally equally spaced on a front side wall thereof for output of air from the air outlets of said fan case upon operation of said fan, top and bottom side walls perpendicularly backwardly extended from top and bottom sides of the front side wall thereof, two protruding engagement portions respectively raised from the top and bottom side walls thereof and adapted to engage the recessed receiving wall portions of said fan case, and a plurality of retaining holes respectively formed on said protruding engagement portions and adapted to receive the spring hooks of said fan case.

3. A detachable cooling device adapted for installation in the shell of a computer mainframe to dissipate heat from the computer mainframe, comprising:

a fan case holding a fan, said fan case comprising a plurality of air inlets on a top side wall thereof corresponding to the fan therein, a plurality of air outlets on a front side wall thereof, a plurality of screw holes on two opposite lateral side walls thereof, two recessed receiving wall portions respectively formed integral with top and bottom side walls thereof around said air outlets, and a plurality of spring hooks respectively formed integral with said recessed receiving wall portions; and a positioning device adapted to secure said fan case to secure said fan case to a hard diskdrive insertion slot on the shell of the computer mainframe, said positioning device comprising a plurality of air vents longitudinally equally spaced on a front side wall thereof for output of air from the air outlets of said fan case upon operation of said fan, two outer mounting strips perpendicularly backwardly extended from two distal ends of the front side wall thereof and adapted for fastening to the hard diskdrive insertion slot of the computer mainframe, and two inner mounting strips perpendicularly backwardly extended from the front side wall thereof and spaced between said outer mounting strips and adapted to hold said fan case, said outer mounting strips each having a plurality of screw holes adapted for fastening to the hard diskdrive insertion slot of the shell of the computer mainframe by screws, said inner mounting strips each having a plurality of elongated mounting slots adapted for fastening to the screw holes of said fan case by screws.

\* \* \* \* \*